United States Patent [19]
Leeson

[11] Patent Number: 5,330,365
[45] Date of Patent: Jul. 19, 1994

[54] ADAPTER UNIT WITH FLEXIBLE CARRIER

[76] Inventor: Anthony M. Leeson, Handelskade 7, 's-Hertogenbosch, Netherlands, 5211-TH

[21] Appl. No.: 17,080

[22] Filed: Feb. 12, 1993

[30] Foreign Application Priority Data

Feb. 13, 1992 [NL] Netherlands .......................... 9200262

[51] Int. Cl.⁵ .............................................. H05K 5/00
[52] U.S. Cl. ...................................... 439/77; 361/749
[58] Field of Search ................... 439/67, 76, 77, 638, 439/650, 651; 361/749

[56] References Cited

U.S. PATENT DOCUMENTS

| | | | |
|---|---|---|---|
| 3,873,889 | 3/1975 | Lebya | 439/77 |
| 4,595,839 | 6/1986 | Braun et al. | 250/551 |
| 4,618,196 | 10/1986 | Muzslay | 439/492 |
| 4,792,879 | 12/1988 | Bauknecht et al. | 361/398 |
| 4,806,107 | 2/1989 | Arnold et al. | 439/79 |
| 4,862,311 | 8/1989 | Rust et al. | 361/91 |
| 4,979,787 | 12/1990 | Lichtenberger | 361/398 |
| 5,134,252 | 7/1992 | Himeno et al. | 361/398 |
| 5,170,326 | 12/1992 | Meny et al. | 439/76 |

FOREIGN PATENT DOCUMENTS

0105589 4/1984 European Pat. Off.
2283528 3/1976 France.
547022 3/1974 Switzerland.

OTHER PUBLICATIONS

IBM Technical Disclosure Bulletin, Sep. 1983, New York, J. R. Gontier, "Connector Support Panel", vol. 26, No. 4, pp. 2018-2019.

*Primary Examiner*—Neil Abrams
*Attorney, Agent, or Firm*—Woodcock Washburn Kurtz Mackiewicz & Norris

[57] ABSTRACT

Adapter, comprising a housing preferably made of plastic, which housing contains at least one flexible printed circuit carrier provided with at least electrical conductive pathways, which carrier is made of a flexible material, for example Kapton, and which conductive pathways on the carrier are electrically connected to at least two terminals of the adapter, wherein the flexible carrier is provided with electronic components on at least one side thereof, the carrier having a metallized side and being folded around the components to shield them from electromagnetic interference, and further having a flap-like portion disposed between the components and an electrical connector mated with the adapter to provide electrostatic protection for the components.

2 Claims, 4 Drawing Sheets

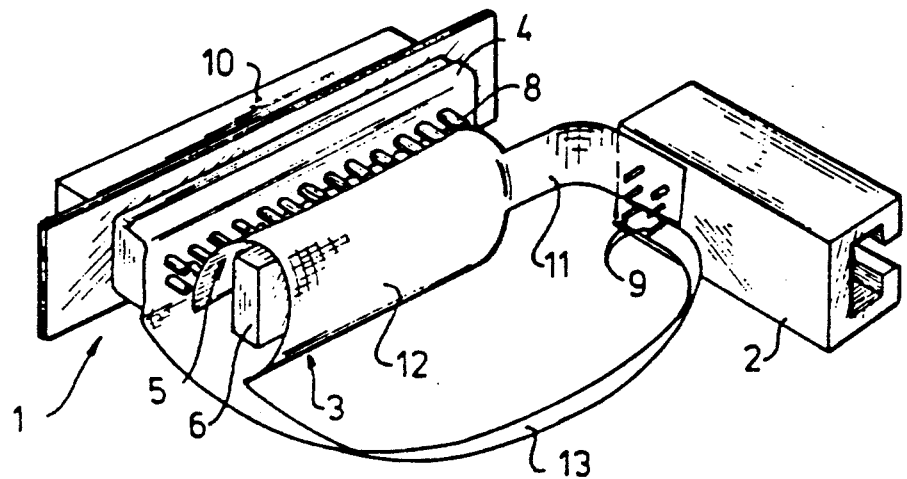
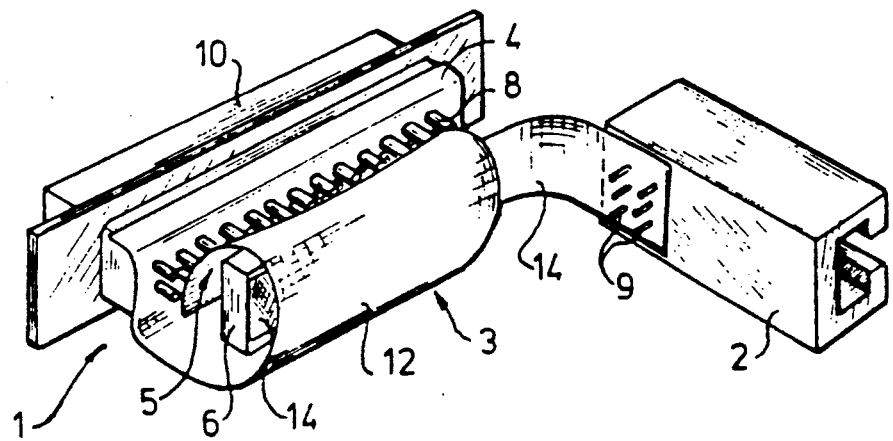

ADAPTER UNIT WITH FLEXIBLE CARRIER

BACKGROUND OF THE INVENTION

The invention relates to an adapter comprising a housing preferably made of plastic, which housing contains at least one carrier formed from a flexible material and provided with at least electrical conductive pathways, which conductive pathways are electrically connected to at least one terminal of the adapter.

Such an adapter is known from U.S. Pat. No. 4,595,839. In general, such adapters are used in communication connections by means of cables. These adapters can serve various purposes. In general, they are used for adapting an electrical connection designed to a particular specification and/or having certain characteristics to the specification and/or characteristics of another connection. One particular connector specification can thus be converted to another. It is also possible for the adapter to be provided with electronic devices for matching impedance levels to each other.

In practice, at least one side of the adapter is provided with a connector which is designed to be able to interact with a mating connector. In most applications for (tele)communications, this connector is provided with at least two parallel rows of conducting terminal connections which have either a "female" or a "male" structure and are designed to interact with the terminal connections which are provided in the mating connector, but are of complementary type. Such a connector connection can comply with, for example, the RS232 standard.

In the adapter known from U.S. Pat. No. 4,595,839 the electrical conductive pathways on the carrier make electrical contact with the terminal connections in the connector. In the known adapter the flexible carrier is only used as a substitute for separate cable connections as to reduce the space within the adapter needed by the electrical wiring. Electronic components within the adapter are arranged on separate printed circuit boards being electrically connected to the flexible carrier. Moreover, separate electrical wiring is applied within the adapter to connect the printed circuit boards to a cable being connected to the adapter. Therefore, the adapter as known is rather complex, whereas during assembling many manufacturing steps need to be done by hand.

It is also known per se to form the terminal connections of the connector on the adapter from two rows of resilient conducting connections placed opposite each other, between which a carrier, provided on both sides with contact faces, can be pushed. If the carrier is pushed between such terminal connections, these contact faces make electrically conductive contact with the respective terminal connections on both sides of the carrier. Sometimes, however, one conductive pathway on one side of the carrier has to make electrically conductive contact with a terminal connection situated directly opposite the other side. This is then achieved in practice by using a loose wire, one end of which is connected to the conductive pathway in question, while the other end is connected to the terminal connection concerned. The application of such loose wires in the adapter produces non-reproducible parasitic capacitances and self-inductances, which become more and more of an obstacle as the standards for the transmission speed of information become more stringent. Furthermore, these loose wires complicate the production process because they have to be fitted and soldered by hand. This means that only a semi-automatic production method is possible.

SUMMARY OF THE INVENTION

The object of the invention is to solve the above-mentioned problems of the known devices and to provide an adapter which has a simple structure and is easy to manufacture.

For this purpose, an adapter according to the invention is characterised in that the flexible carrier is provided with electronic components on at least one side. Arranging the electronic components on the flexible carrier means that no loose wires are needed anymore inside the housing of the adapter, that reproducible parasitic capacitances and self-inductances occur, and the production costs are reduced, because less steps during the assemblage need to be done by hand. The layout of conductive pathways and any electronic components on the carrier can consequently meet very high standards with respect to minimum separations between shielded and unshielded parts thereof. This increases the reliability of the adapter compared with conventional adapters having combinations of one or more printed-circuit boards and wire connections. Furthermore, during the assemblage the so-called flow soldering process may be applied. Only when it is being mounted in the adapter need the flexible carrier be bent in such directions that the carrier can be connected to the terminals.

In one embodiment of the invention, the flexible material is a polyimide material, preferably Kapton. This material is simple to treat and is resistant to soldering temperatures.

In another embodiment of the invention, the flexible carrier is substantially entirely metallised on one side and this carrier is folded around the electronic components in such a way that they are shielded against electromagnetic interference. This leads to simple and efficient electromagnetic shielding of the components and avoids the need for a metal shield on the inside of the housing of the adapter.

In another embodiment of the invention, the flexible carrier is provided with one or more lips projecting laterally from the carrier, each being provided with respective necessary conductive pathways and leading to a terminal of the adapter. Such lips considerably increase the potential applications.

In another embodiment of the invention, at least one terminal of the adapter is a connector provided with a metal casing, the carrier is provided at one end with a metal strip, and this end, provided with a metal strip, is folded over and is connected substantially over its entire length in an electrically conductive manner to the casing. This provides a low-impedance earth on the flexible carrier over a large area, from where earth pathways are simple to produce over the flexible carrier.

The adapter can also contain more than one flexible carrier, which also increases the potential applications.

In another embodiment, the adapter comprises at least two connectors, and the electronic components on the carrier are electrical or electrostatic protecting components.

Finally, the adapter can be made suitable for use as an optoelectronic adapter.

BRIEF DESCRIPTION OF THE DRAWINGS

The invention will be explained below with reference to a drawing, which serves only as an illustration and is not intended to limit the scope of the invention. In the drawing:

FIGS. 2, 3 and 4 show other embodiments of the adapter according to the invention;

DETAILED DESCRIPTION OF THE EMBODIMENTS

Figure 1:
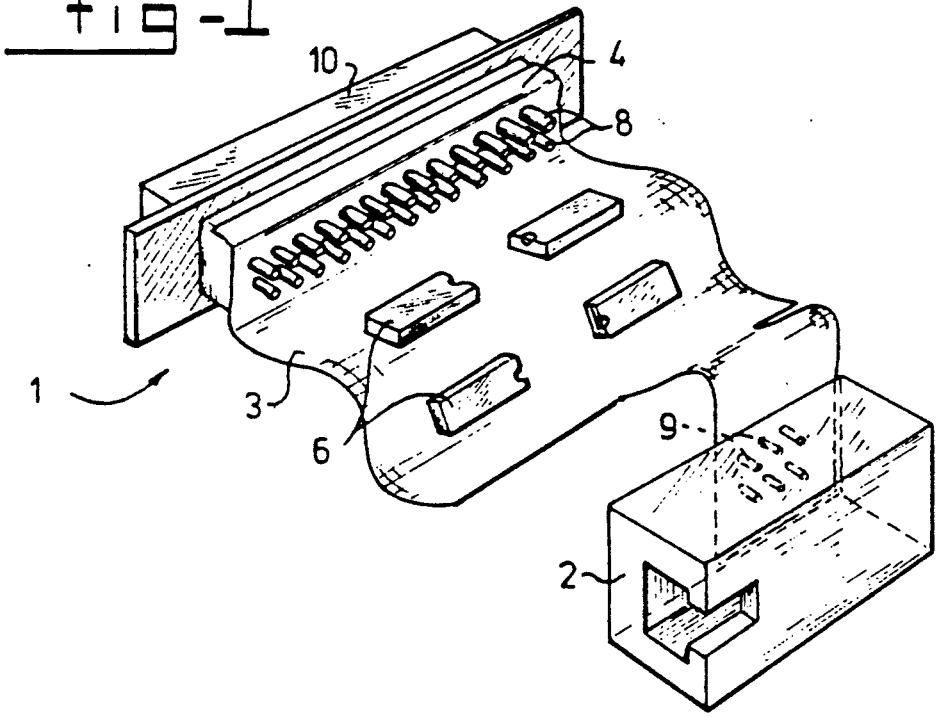
FIG. 1 shows a first embodiment of the adapter according to the invention.

FIG. 1 shows a first embodiment of the present invention. The embodiment shown therein is suitable for converting a first connector specification to a second one. The adapter comprises a first connector 1 having the first connector specification and a second connector 2 having the second connector specification. Inside the housing 15, which is not shown in FIG. 1, but is shown in FIG. 5, the terminal connections 8 of the first connector 1 are electrically connected to conductive pathways on a flexible carrier 3 (see FIG. 6 for an example of such conductive pathways). Since the carrier 3 can be laid flat against the connector 1, all terminal connections 8 can be connected directly, i.e. without using additional loose wires, to conductive pathways on the carrier. For this purpose, the terminal connections 8 are inserted into corresponding holes in the flexible carrier and soldered in known manner to the above-mentioned conductive pathways. The conductive pathways lead indirectly, via electronic components 6, or directly to the terminal connections 9 of the connector 2, with which they are in good conductive contact. The electronic components 6 can serve different purposes, for example electrical or electrostatic protection of circuits connected to the adapter.

The first connector 1 preferably has a metal casing 10 and is preferably of the so-called "D-type". The first connector 1 can be provided with a filter if desired. The second connector 2 can also be of the "D-type", but this is not necessary. The latter connector 2 can also be, for example, a modular contact socket, possibly provided with a metal casing, and possibly provided with a filter.

The end 4 of the flexible carrier 3 is preferably folded over at the position of the first connector 1 and provided with a metal layer which is soldered firmly onto the metal casing 10 of the first connector 1. In this way, a layer at ground potential is present on the carrier and is connected via a very low impedance to the casing 10. In view of the large surface with which this ground connection is produced, it is simple to provide conductive pathways at ground potential everywhere on the carrier 3 without additional wires being necessary for providing ground potential. The ground thus available can be guided simply via a conductive pathway via the flexible carrier to the second connector 2, and connected there either to one of the terminal connections 9 or to a metal casing provided there (not shown), again without any additional wiring being necessary for this. This reduces the production time, and therefore the costs. The reliability is also increased in this way.

The flexible carrier 3 is preferably made of Kapton, but can in fact be made of any desired polyimide material which can withstand soldering.

Figure 2:
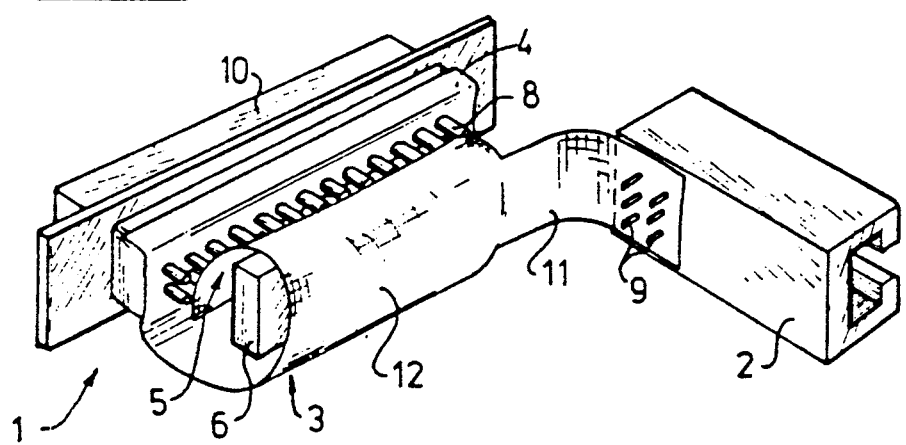

FIG. 2 shows an embodiment of the present invention in which the flexible carrier 3 is provided with a lip 11. The underside of the carrier 3 can be provided substantially entirely with a metal layer 12, which metal layer 12 is electrically connected to the casing 10 of the first connector 1, and thus forms a ground plate. In the example of FIG. 2 this ground plate is folded around the electronic components 6, so that the folded, flexible carrier 3 forms an electromagnetic shield for the components 6. This means that a metal cage inside the housing 15 (FIG. 5) is no longer needed. The lip 11 is also provided with conductive pathways (not shown) which are in electrical contact with respective components and/or respective conductive pathways on the flexible carrier 3. This lip 11 extends laterally in the direction of the second connector 2, where the above-mentioned conductive pathways of the lip 11 are electrically connected to the terminal connections 9 of the second connector 2.

Reference sign 5 designates a part of the flexible carrier 3 on which there are no components. Even if the underside of the carrier 3 is not provided with a metal layer 12, the curved structure of FIG. 2 has a function: the flap 5 of the carrier 3 is then situated as an insulating layer between the electrical components 6 and the terminal connections 8, so that the occurrence of sparks between terminal connections 8 at high voltage and the electrical components 6 is largely counteracted. In other words, the flap 5 provides electrostatic protection of the electrical components 6.

It is possible to provide a flexible carrier 3 with several lips which each extend laterally at a desired place on the edge of the flexible carrier 3. The loose end of each lip can then, for example, always be connected to a part of the terminal connections 9 of the second connector 2 after being folded in a suitable manner.

FIG. 3 shows the situation in which the carrier 3 has two lips 11, 13 extending outwards on opposite sides of the carrier 3. The end of lip 11 is connected to four pins of the terminal connections 9, and the lip 13 to two pins thereof. These numbers serve only by way of example. More than two lips can also be provided.

FIG. 4 shows an adapter which is very similar to that of FIG. 2. the same parts are indicated by the same reference signs. The only difference from the adapter of FIG. 2 is the second flexible carrier 14 which replaces the lip 11. The second flexible carrier 14 is separated from the first flexible carrier 3 and is fixed to electrical terminal connections of the electrical components 6 which connections are situated, for example, on a side face of the components 6 and make no contact with the first flexible carrier 3. The second flexible carrier extends laterally through an opening left free by the curved first carrier 3 in the direction of the second connector 2. Several of these loose flexible carriers can be provided if desired. Lips 11, 13 can also be combined with two or more loose flexible carriers. The underside of the first carrier 3 can again be provided with a metal layer 12, but this is not necessary.

Figures 5A, 5B:
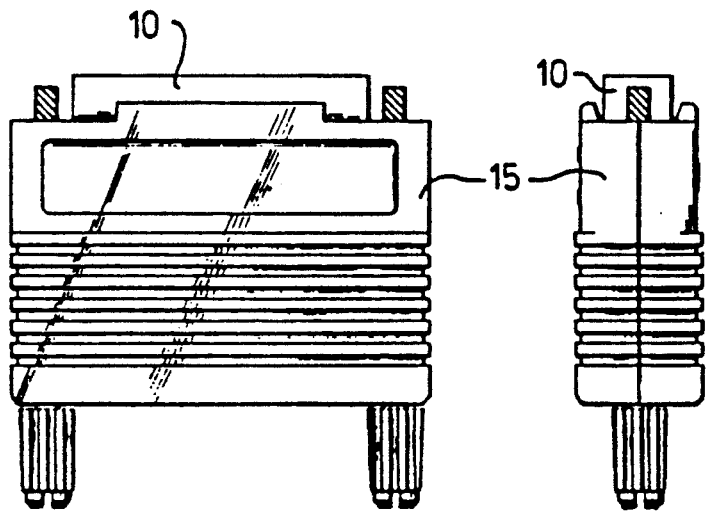
FIGS. 5(A-E) show an adapter according to the invention, including its housing, and accompanied by two connectors.
Figures 5C, 5D:
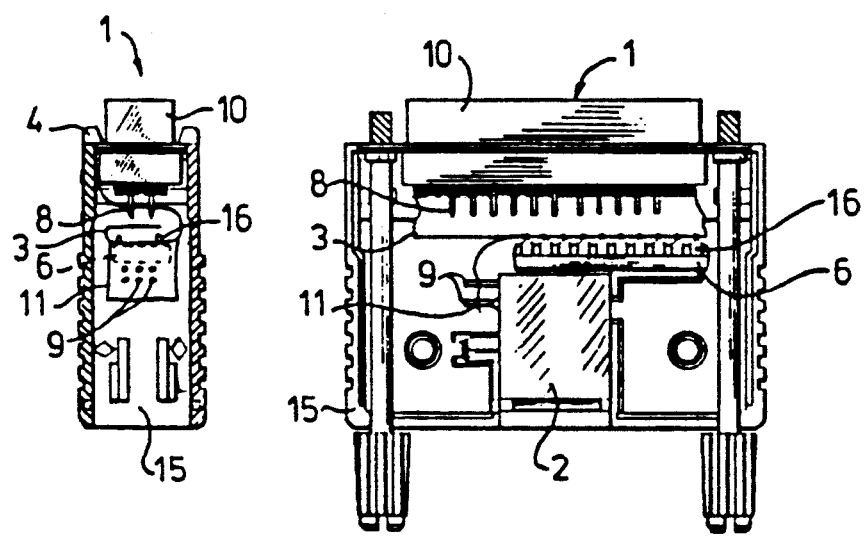
Figure 5E:
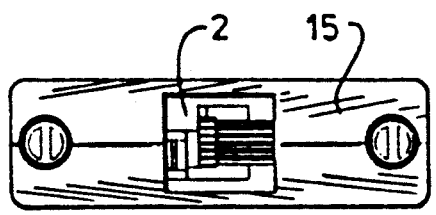

FIGS. 5a to 5e show an adapter provided with a plastic housing 15, inside which the flexible carrier 3 is situated. FIG. 5a shows a side view of the adapter along the long side of the adapter. The form which can be seen in FIG. 5a is in principle arbitrary and is not intended to limit the invention. This also applies to FIG.

5b, which shows a side view along the shortest side of the adapter.

Figure 6:
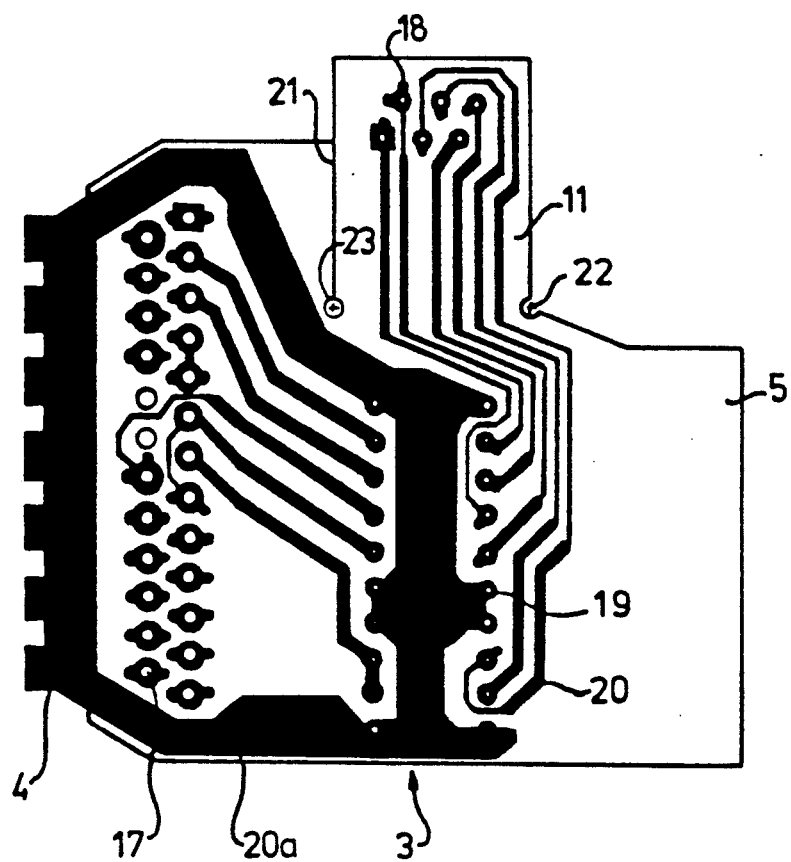
FIG. 6 shows a flexible carrier according to the invention.

FIG. 5c shows a cross-section of the adapter, seen from the same side as in FIG. 5b. In FIG. 5c the parts already discussed in the previous figures are again indicated by the same reference signs. The flexible carrier 3 is fixed at one side, via a curved metal strip 4, to the casing 10 of the connector 1. The terminal connections 8 for this purpose project through openings 17 (see FIG. 6) and are electrically connected to conductive pathways 20, 20a provided on the carrier 3 (see also FIG. 6), for example by means of a flow soldering process. The carrier 3 is bent over inside the plastic housing 15 and leads to an electronic component 6. In the situation shown, the component 6 is an integrated circuit (IC) with a total of twenty terminal pins 16. The terminal pins 16 project through the same number of holes 19 in the carrier 3 (c.f. FIG. 6) and are soldered where desired to one or more conductive pathways 20. The component 6 is situated here on the other side of the carrier 3 from that in the situation in FIGS. 2, 3 and 4. This is not, however, of vital importance, although an advantage of the construction in FIG. 5c (and 5d) is that three insulating layers are situated between the terminal connections 8 and the component 6 in the situation in FIGS. 5c and 5d. This ensures very good electrostatic protection of the component 6.

The second connector 2 is situated below component 6, as can best be seen in FIG. 5d, which shows a cross-section along the long side of the adapter. The terminal connections 9 of the second connector 2 project through corresponding openings 18 (see FIG. 6) in the lip 11, which extends laterally from the carrier 3, in the same manner as illustrated in FIG. 2.

The connector 1 is accessible from the top for a mating connector interacting therewith, which is not shown, but which is well-known. The connector 2 is also accessible from the bottom for a mating connector interacting therewith, not shown either, but equally well-known. Connector 1 in this example of an embodiment has twenty-five terminal pins 8, and connector 2 has six terminal pins 9. Other quantities are, however, possible within the scope of the invention. The position of the connectors inside the adapter is also freely selectable. The connectors 1, 2 or the mating connectors can also be provided with mechanical resilient means which produce mechanical snap connections when a connector is connected to its respective mating connector, so that the connector and mating connector cannot be detached from each other simply by pulling, but the snap connection first has to be opened. Such mechanical, resilient connections are known per se and are shown, for example, in the above-mentioned Dutch Patent Application 9,000,967, filed by the same Applicants as of the present invention.

So far only two connectors 1, 2, forming part of the adapter, have constantly been mentioned. However, the invention is not limited to this number. It is also possible for the adapter to be provided with a connector on only one side, while the other side is connected to a cable firmly connected to the adapter. This can be the case, for example, if the adapter forms part of an extension cable. The adapter can also be fixed on one side to an electrical device. The preferred application is, however, a loose adapter provided with two connectors 1, 2, in which the flexible carrier is provided with electrical or electrostatic protecting components. It is, however, also possible within the scope of the invention to fit more than two connectors on the housing 15 of the adapter. Such an adapter can advantageously be combined with two or more flexible carriers or with one carrier provided with various laterally directed lips, of the type described above. The positions of such connectors on the adapter are freely selectable and are determined only by the specific demands of the particular application.

It is possible to make an adapter according to the invention suitable for an optoelectronic adapter, as known, for example, from Dutch Patent Application 9,000,967, mentioned above. In an optoelectronic adapter, one terminal of the adapter receives an optical signal, via a connector connection or directly, and the other terminal receives an electronic signal, again via a connector connection or directly. There are then at least optoelectronic converters on the flexible carrier (or carriers) used in such an adapter according to the invention, for converting optical signals into electrical signals and/or vice versa.

FIG. 6 shows an example of a flexible carrier 3 according to the invention, of the type used in the adapter in FIG. 5. Conductive pathways 20 are arranged on one side of the carrier 3 in a manner which is known to a person skilled in the art. A part 20a of the conductive pathways is in conductive contact with the metal layer 4 mentioned above, which preferably extends slightly beyond the carrier 3 and is connected in an electrically conductive manner to the casing 10 of connector 1, for example by soldering. The conductor 20a forms a ground line with a relatively large surface area and also extends under the integrated circuit 6, which is mounted via its terminal pins 16 in the holes 19 of the carrier 3. The respective terminal pins 16 are then soldered to the respective conductive pathways 20. In the same way, the terminal pins 8 of the first connector 1 are inserted into the holes 17 and soldered to the respective conductive pathways 20. The same applies to the terminal pins 9 and the holes 18 in the lip 11. A side edge 21 of the lip 11 is cut to a hole 23 in the carrier 3. Together with a notch 22 in the other side edge of the lip 11, at the transition to the carrier 3 itself, hole 23 ensures that the lip 11 can be bent over simply and at a reproducible place relative to the carrier 3.

The invention is not limited to the examples of embodiments shown in the drawing and discussed above. The invention is limited only by the scope of the appended claims. In particular, electronic components can be provided on both sides instead of on only one side of the flexible carriers 3, 7. Electronic components could also be provided on lips 11, 13.

I claim:

1. An adapter for mating two connectors, comprising:
   a housing for supporting first and second electrical connectors on two sides of said housing, said housing having a first opening for mating connection with the first electrical connector and a second opening for mating connection with the second electrical connector;
   a carrier disposed in said housing and formed from a flexible material, said carrier having:
   a first and second surface;
   electrical conductive pathways on said first surface, said carrier connected to the first and second electrical connectors with said conductive pathways being electrically connected to terminals on the first and second electrical connectors;

one or more electronic components disposed on said first surface, each said component electrically connected to said conductive pathways;

a flap-like portion; and said carrier wrapped around each said component in such a manner as to disposed said flap-like portion between each said component and the terminals of the first connector, wherein said flap-like portion provides electrostatic shielding for each said component.

2. The adapter of claim 1, further comprising a flexible layer of metal on said second surface of said carrier.

* * * * *